United States Patent
Borkar et al.

(10) Patent No.: US 6,272,666 B1
(45) Date of Patent: Aug. 7, 2001

(54) TRANSISTOR GROUP MISMATCH DETECTION AND REDUCTION

(75) Inventors: Shekhar Y. Borkar; Vivek K. De, both of Beaverton; Ali Keshavarzi, Portland; Siva G. Narendra, Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/224,574

(22) Filed: Dec. 30, 1998

(51) Int. Cl.⁷ ................................................ G06F 17/50
(52) U.S. Cl. ...................................................... 716/5
(58) Field of Search ............................................ 716/4, 5

(56) References Cited

U.S. PATENT DOCUMENTS

| | | | |
|---|---|---|---|
| 5,422,591 | 6/1995 | Rastegar et al. | 327/409 |
| 5,461,338 | 10/1995 | Hirayama et al. | 327/534 |
| 5,477,460 | * 12/1995 | Vakirtzis et al. | 716/5 |
| 5,559,368 | 9/1996 | Hu et al. | 257/369 |
| 5,586,332 | 12/1996 | Jain et al. | 713/322 |
| 5,623,647 | 4/1997 | Maitra | 713/501 |
| 5,634,131 | 5/1997 | Matter et al. | 713/322 |
| 5,655,127 | 8/1997 | Rabe et al. | 713/322 |
| 5,703,522 | 12/1997 | Arimoto et al. | 327/534 |
| 5,719,800 | 2/1998 | Mittal et al. | 713/321 |
| 5,880,620 | 3/1999 | Gitlin et al. | 327/534 |
| 5,909,140 | 6/1999 | Choi | 327/534 |
| 6,046,627 | 4/2000 | Itoh et al. | 327/534 |

FOREIGN PATENT DOCUMENTS

98/59419   12/1998   (WO) .

OTHER PUBLICATIONS

U.S. application, No. 09/183,255, filed Oct. 30, 1998, "Method and Apparatus For Power Throttling in a Microprocessor Using a Closed Loop Feedback System,", Browning, et al.

J. Kao, "SOIAS For Temperature and Process Control," Massachusettes Institute of Technology, 6.374 Project, Dec. 1996.

M. Miyazaki et al. "A Delay Distribution Squeezing Scheme with Speed–Adaptive Threshold–Voltage CMOS (SA–Vt CMOS) for Low Voltage LSIs," 1998 International Symposium on Low Power Electronics and Design Proceedings, pp. 48–53, 1998.

T. Kuroda et al., "A 0.9V, 150–MHz, 10–mW, 4mm2, 2–D Discrete Cosine Transform Core Processor with Variable Threshold–Voltage (VT) Scheme," IEEE J. of Solid–State Circuits, vol. 31, No. 11, Nov. 1996, pp. 1770–1777.

* cited by examiner

*Primary Examiner*—Trong Phan
(74) *Attorney, Agent, or Firm*—Alan K. Aldous

(57) ABSTRACT

In some embodiments, the invention includes a system having first and second domains. The system includes a first performance detection circuitry including some transistors of the first domain to provide a first performance rating signal indicative of transistor switching rates of the first domain. The system includes second performance detection circuitry including some transistors of the second domain to provide a second performance rating signal indicative of transistor switching rates the second domain. The system further includes control circuitry to receive the first and second performance rating signals and control a setting for a body bias signal for the first domain and control a setting for a body bias signal for the second domain responsive to the performance rating signals. In some embodiments, the control circuitry also provides supply voltage signals and clock signals responsive to the performance signals. The first and second domains may have clock signals with the same frequency and the bias values are set such that the transistors of the first and second domains can switch properly while the first and second domains have the clock signals and wherein one of the first and second domains operates at less than optimal performance.

28 Claims, 9 Drawing Sheets

TRANSISTOR GROUP MISMATCH DETECTION AND REDUCTION

BACKGROUND OF THE INVENTION

1. Technical Field of the Invention

The present invention relates circuits and, more particular, to transistor group mismatch detection and reduction.

2. Background Art

The performance of a transistor includes the rate at which the transistor can switch states. The performance of an integrated circuit (also called a chip or die) is related the clock frequency, which may be limited by transistor switching speed. Other parameters of an integrated circuit include its temperature and power consumption. If the chip temperature is above a maximum, the transistor might not properly switch or retain its state. The performance, power consumption, and temperature are typically related. The active power of a transistor is $P=CV^2F$, where C is the capacitance, V is the supply voltage, and F is the switching frequency. For example, transistors with a greater switching rate, consume energy in a shorter period of time, which generates heat over a smaller period of time thereby increasing the temperature of the chip. If the clock frequency and programs being run are such that a high switching rate is sustained, the temperature may be so high that thermal reduction mechanisms are not adequate.

For example, consider a portable computer (such as a handheld or laptop computer) that includes a processor such as a Pentium® II processor manufactured by Intel Corporation. The temperature of the processor chip may be a function of the switching rate of the transistors, the clock frequency, and the program being run by the computer. Word processing programs tend to make relatively little demands on the processor while the user is doing tasks such as editing and printing. Accordingly, even if the transistors have a relatively high switching rate and clock rate, when running only a word processing program, the temperature of the chip will not exceed a particular temperature limit. By contrast, when running certain other programs (such as games or other programs involving extensive computations for 3D graphics), or a combination of programs in multi-tasking, the processor may be required to sustain a high rate of transistor switching per unit time leading to substantial power consumption and resulting temperature increase. The heat generated by the processor over this time may be greater than the computer thermal reduction mechanism can deal with leading to overheating of the processor and perhaps other portions of the computer.

The switching rate can also lead to an increase in power consumption rate because more instructions can be executed in a shorter amount of time. This is particularly a problem with battery driven processors.

SUMMARY

In some embodiments, the invention includes a system having first and second domains. The system includes a first performance detection circuitry including some transistors of the first domain to provide a first performance rating signal indicative of transistor switching rates of the first domain. The system includes second performance detection circuitry including some transistors of the second domain to provide a second performance rating signal indicative of transistor switching rates the second domain. The system further includes control circuitry to receive the first and second performance rating signals and control a setting for a body bias signal for the first domain and control a setting for a body bias signal for the second domain responsive to the performance rating signals.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

A. Transistor Group Mismatch Detection and Reduction

During the fabrication of transistors, although the intent may be to make the transistors equal, the reality is that different transistors have different characteristics (also called transistor parameters). The differences are referred to as transistor parameter variations. Of course, a chip may include different characteristics in different transistors which are intended to be different. For example, a pFET transistors may be intended to have different characteristics that an nFET transistor.

Examples of the transistor parameters include threshold voltage and switching rates. For example, if the two different transistors each have the same body bias, supply voltage, and frequency, they may have different threshold voltages and different switching rates. The degree of the transistor parameter variations is often a function of the proximity of transistors in space. For example, the transistor parameter variations in two groups of transistors on the same chip are likely to be less than the transistor parameter variations in two groups of transistors on two different chips. Further, it may be that it is more likely to have greater transistor parameter variations between chips fabricated at different times.

Figure 3:
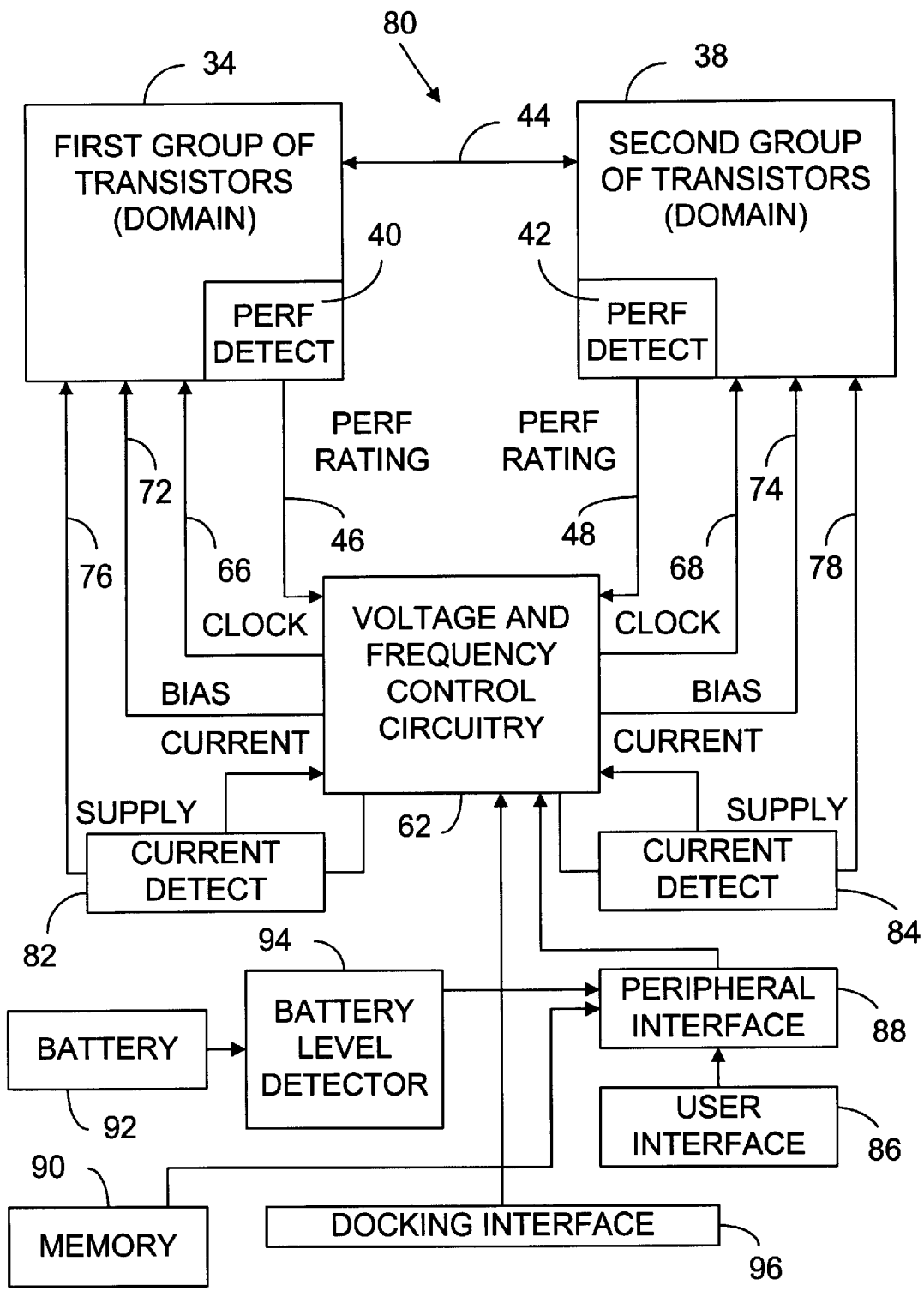
FIG. 3 is a block diagram representation of similar to the system of FIG. 1, but further illustrating a user interface, current detection circuitry, battery level detection circuitry, and a docking interface according to some embodiments of the invention.

There may be transistor parameter variations between two groups of transistors because of the transistor parameter variations in the individual transistors. For example, a first domain as a whole may perform differently than a second domain as a whole. The difference in transistor parameters in two different groups of transistors is mismatching. The groups of transistors are referred to herein as domains. (A domain may include components in addition to transistors.) Different domains may be on the same chip, on different chips in the same system, or in different chips in different systems. The domains may each be part of different chips or different functional unit blocks (FUBs). For example, as illustrated in FIG. 3, each domains 34 and 38 may each be the interface circuitry to connect to an interconnect 44 between chips or FUBs. The interconnect circuitry might have the same clock rate, while the other portions of the chip might not.

In some embodiments, the invention includes circuitry to detect mismatches of transistor parameters in different groups of transistors and to correct the mismatches by providing different signals levels to the different groups of transistors. The following examples illustrate detection and correction of mismatches between two groups of transistors. However, it may be desirable to detect and correct mismatches between more that two groups of transistors.

A reason why it is desirable to reduce mismatches is that if groups of transistors may run off the same clock signal or otherwise need to run synchronously. Where there are differences in parameters, if other signals are not used, in some cases the only way to get the groups running at off the same clock signal is to lower the clock signal frequency. This will yield lower performance for the domain which can perform acceptably with a higher clock frequency. However, the invention is not limited to correcting mismatches between groups of transistors that run off the same clock or that have to run synchronously. Indeed, there can be reasons to correct for mismatches between groups of transistors that run off a different clock signal or that are asynchronous.

The signals used to reduce mismatches include body bias signals. For example, one reason why there may be a difference in performance among groups of transistors is because some or all of the transistors in one domain different threshold voltages than some or all of the transistors in another domain. Altering the body bias to one domain or to part of the transistors in that group may bring the performance of that group more in line with the performance of another domain. As described below, changes in body bias voltages may be used in combination with changes in other signals such as supply voltage and clock frequency.

Figure 1:
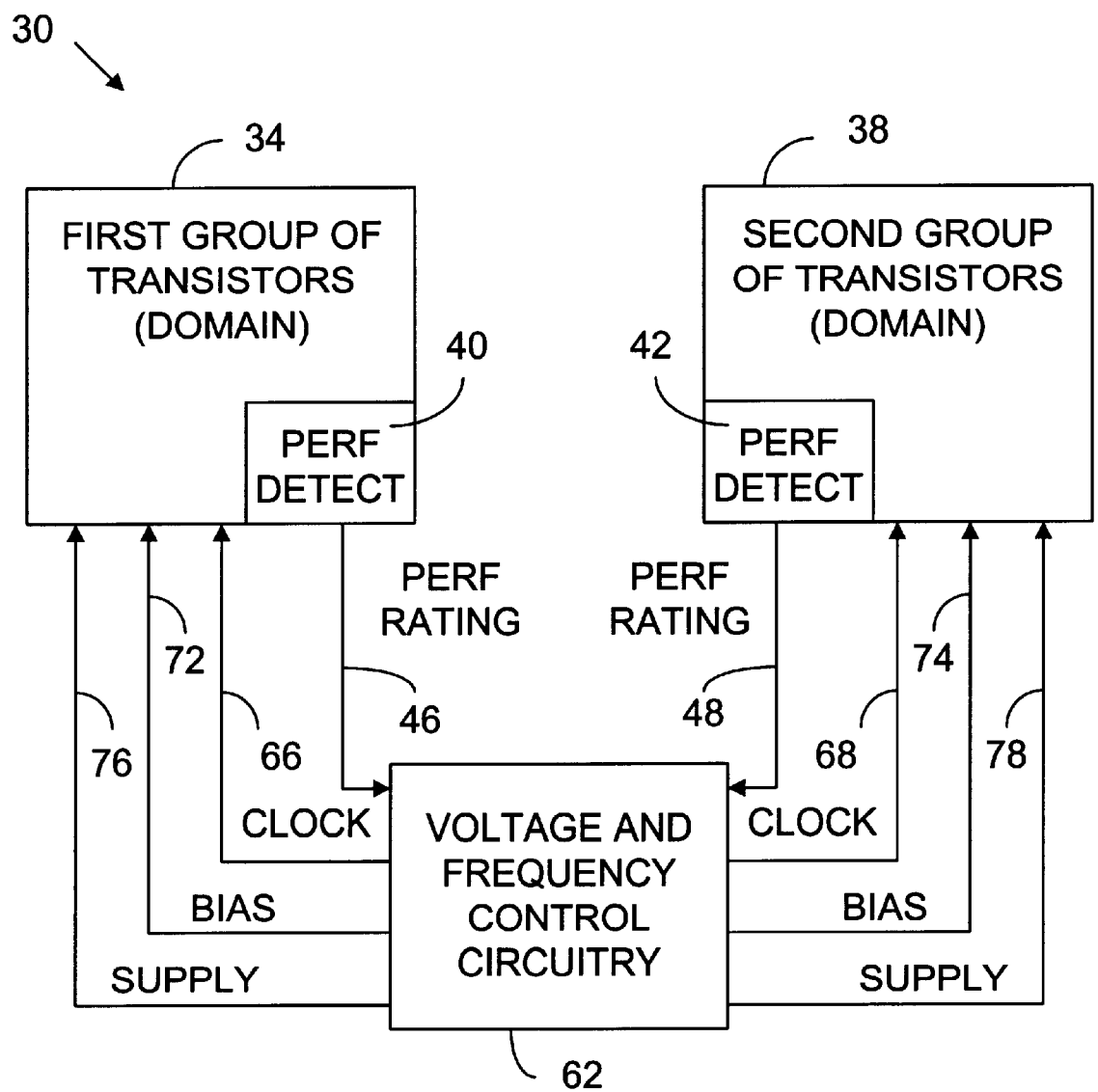
FIG. 1 is a block diagram representation of a system including first and second domains, first and second performance detection circuitry, and control circuitry according to some embodiments of the invention.

Referring to FIG. 1, a system 30 includes a first group of transistors (domain) 34 and a second group of transistors (domain) 38. The first and second domains may be on the same chip, on two different chips in the same system, or in different chips in two different systems. The first and second groups of transistors may be different function unit blocks (FUBS) on the same chip. Because of transistor parameter variations, certain performance and/or power parameters of first domain 34 may be different than that of the second domain 38. For example, if the first and second domain 34 and 38 each have the same body bias, supply voltage, and frequency, they may have different threshold voltages and different switching rates.

Figure 2:
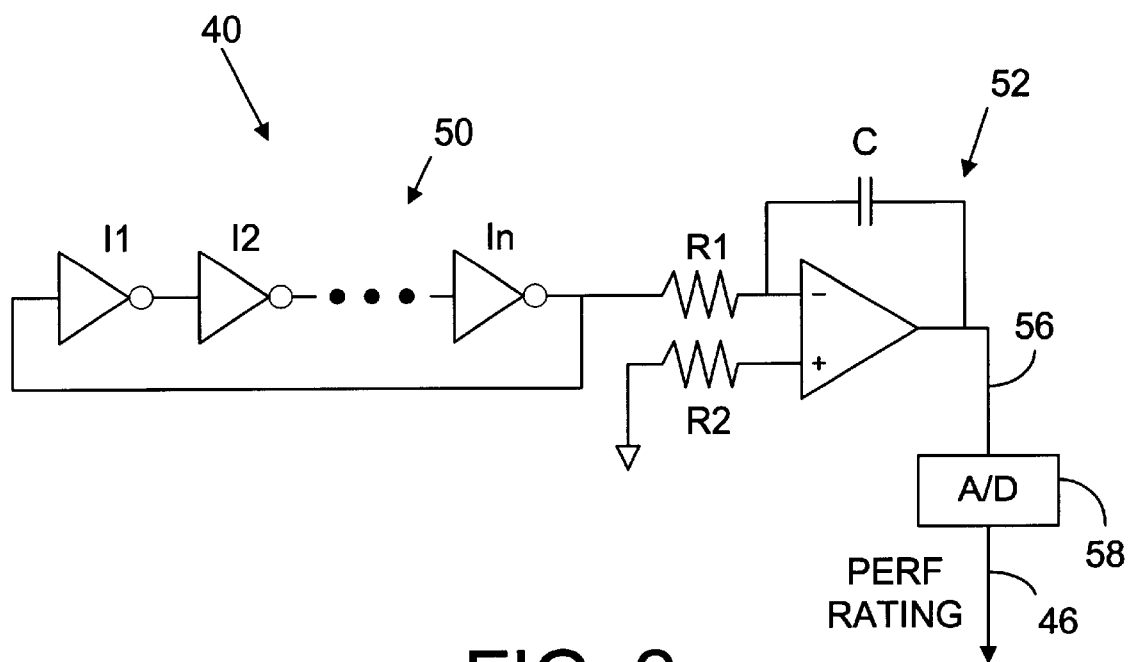
FIG. 2 is a schematic representation of the first performance detection circuitry of FIG. 1.

Performance detection circuitry 40 makes an assessment of the performance of the first domain and provides a performance rating signal on conductors 46. Performance detection circuitry 42 makes an assessment of the performance of the second domain and provides a performance rating signal on conductors 48. There are various ways in which an assessment of the performance of the groups of transistors can be made. For example, referring to FIG. 2, in some embodiments, performance detection circuitry 40 includes a ring oscillator 50 that includes an odd number of inverters I1, I2, . . . In, where n is the number of inverters and is at least 3. The signal at a node N1 is a periodic signal with a period of 2nD, where n is the number of inverters and D is the average delay through the inverters. The transistors included in the inverters are among the first domain 34 and, therefore, are hopefully representative of the first domain. The larger the number n, the more likely it is that the signal at node N1 will provide an accurate assessment of the performance of the first domain 34. If the domain is an entire chip which is compared with another chip with mismatch detection and reduction, it may make sense to include more than one domain in a chip. The performance rating signal gives an indication of the average speed of the transistors of the domain. Applying a more forward body bias, reduces the delay.

An integrator 52 integrates the signal at node N1 to produces an analog performance signal rating signal on conductor 56. That analog performance rating signal is converted to a digital signal by analog-to-digital converter (A/D) 58 to produce the performance rating signal on conductors 46 shown in FIGS. 1 and 2. Performance detection circuitry 42 may have an integrator and A/D the same as integrator 52 and A/D 58 so that if there were no mismatch, the performance signals on conductors 46 and 48 would be the same.

The performance rating signal can be thought of as a figure of merit of how quickly the transistors of the first group can switch. The performance rating signal can be calibrated to a clock frequency for which the transistors of the group can acceptably switch. For example, a performance rating signal of Y on conductors 46 may mean that the transistors of the first group 34 can switch acceptably when there is a clock frequency of 350 Mz and a performance rating signal of X may mean that the transistors can switch acceptably when there is a clock frequency of 400 Hz, etc. By adjusting the body bias signals and/or supply voltage, the performance rating signal can change.

Referring to FIG. 1, the performance rating signals on conductors 46 and 48 are provided to control circuitry 62 (hereinafter control circuitry 62), which is used to reduce mismatch. Control circuitry 62 provides a clock signal on conductor(s) 66 to the first domain 34 and a clock signal on conductor(s) 68 to the second domain 38. In some embodiments, conductors 66 and 68 are tied together so they carry the same clock signal. In some embodiments, the clock signals on conductors 66 and 68 are the actual clock signal used by the first and second domains. In other embodiments, the clock signals on conductors 66 and 68 are control signals used to control other circuitry such as a phase locked loop (not shown in FIG. 1) to produce the actual clock signals. In some embodiments, there are multiple levels of possible frequencies for the clock signals (examples include two levels or three levels). In other embodiments, there is only one frequency for the clock signals.

Control circuitry 62 provides a body bias signal(s) on conductor(s) 72 to the first domain 34. Control circuitry 62 provides a body bias signal(s) on conductor(s) 74 to the second domain 38. The same or different body bias signals may be applied to different transistors of the first domain and the same or different body bias signals may be applied to different transistors of the second domain. Further, some body bias signals may be for pFET transistors, while others are for nFET transistors. The body bias signals may be the actual body bias signals applied to the bodies of the transistors or control signals to control circuitry (not shown in FIG. 1) that provides the actual body bias signals applied to the transistors. In some embodiments, there is only one level of body bias signal. In other embodiments, there is more than one level of body bias signal.

Control circuitry 62 provides a supply voltage signal on conductor(s) 66 to the first domain 34. Control circuitry 62 provides a supply voltage signal on conductor(s) 68 to the second domain 38. The supply voltage signals may be the actual supply voltage Vcc (sometimes called Vdd) applied to the transistors or a control signal which controls the supply signal actually applied to the transistors. In some embodiments, different transistors received different supply voltage signals, in other embodiments, they each receive the same. In some embodiments, there is only one level of supply voltage that may be applied. In other embodiments, there is more than one level of supply voltage that may be applied (examples include two levels or three levels).

In some cases, mismatch reduction may completely eliminate mismatch, at least in so far as it makes a difference, such that none of the domains is required to reduce its performance to achieve mismatch. In other cases, it will not be possible to completely eliminate mismatch and still keep one of the domains at a high performance level. In such cases, it may be that the only way to effectively deal with mismatch will be to reduce the performance of at least one of the domains.

There may be a variety of goals in detecting and reducing mismatch. Examples of the goals include keeping power consumption below a particular level, keeping temperature in a particular range, obtaining the highest possible performance, and obtaining the highest performance while not exceeding a particular power consumption level. Other objectives may be a goal of detecting and reducing mismatch. There are many algorithms that can be followed to detect and reduce mismatch between domains. As the number of domains increase and the number of variables increases, the task of solving the program becomes greater and more time consuming. Accordingly, it may be desirable to include simplifying assumptions and/or a relatively small number of options to reduce the complexity. Indeed the invention is not limited to finding an optimal solution, which may be so time consuming as to be not practical. The following describes some of the algorithms that might be used in particular cases, but the invention is not limited to the particular examples.

The performance ratings of a domain may be determined for certain settings of supply voltage and body bias during pre-testing or actual use and stored in volatile or non-volatile memory in a chip or elsewhere for future use.

1. Performance considerations

One way to achieve the highest performance that will be allowed with the same clock frequency is to determine the highest performance rating signal that can be achieved by domain 34 and the highest performance rating signal that can be achieved by domain 36. One way to do this is applying the highest supply voltage and the body bias leading to the lowest threshold voltage and seeing which performance rating signal is higher. Then the supply voltage and body bias signals applied to the domain with the high performance rating signal are changed until the performance rating of the higher signal is equal to that of the lower signal.

Accordingly, if there is a significant mismatch, the there may be different supply voltage and/or body bias signals applied to the different domains. (Depending on the number of bits in the output of the A/D converter, it may be that the performance signals only need to be in a certain range to be considered equal.) Alternatively, different supply voltage and body bias values (e.g., a zero body bias) can be initially applied to domains 34 and 36 to see which values yield the higher performance rating signal. Then the performance of the domain with the higher performance rating signal is reduced until they performance rating signals are equal and can both work acceptably with the same clock signal. Other algorithms may be used to achieve high performance where each domain has the same clock frequency. In making the setting choice, control circuitry 62 may make tradeoffs of active versus leakage power consumption.

2. Power considerations

In practice, the maximum performance may lead to an unacceptably high power consumption and heat. In many situations, then, control circuitry 62 may seek to obtain the highest performance that both domains can achieve at the same clock frequency and with exceeding a power consumption level. The actual and acceptable power consumption levels could be different for the different domains. Different techniques may be used to not exceed power consumption levels. A simple but imprecise way is to not allow the supply voltage, threshold voltages, or frequency, to pass certain levels. A more precise way is to detect current being consumed. The power can be determined from the current and supply voltage. Referring to FIG. 3, a system 80 is similar to system 30 in FIG. 1 except that it further includes current detection circuitry 82 and 84, which provides current signals to control circuitry 62. Further system 80 may include a battery 92 and battery level detector 94 which provides an indication of a level of battery 92 to control circuitry 62. Further, system 80 includes a user interface 86 (such as a key board and/or mouse) and a peripheral interface 88, which allows a user to specify how long battery 62 should last or other considerations regarding power, performance, and/or heat. Further, a docking interface 96 may provide a signal pertinent to power considerations. Power considerations are discussed elsewhere in this disclosure. In different embodiments, system 80 may include each of the current detection circuitry 82 and 84, battery 92 and battery level detector 94, user and peripheral interfaces 86 and 88, and docking interface 96 or only some of them. A memory 90 may hold an operating system, other programs, or signals indicating constraints on performance, power consumption, and/or temperature of the first and second domains. These components can provides input signals that are considered by control circuitry 62 in deciding power constraints.

3. Temperature considerations

A system like systems 30 or 80 may include temperature sensitive elements that provide an indication of the temperature of the domains. (This is illustrated and discussed elsewhere in the disclosure.) Control circuitry 62 can make the body bias, supply voltage, and clock frequency settings so as to keep at a temperature or temperature range.

The following sections of the disclosure (sections B and C) provide information regarding inventions which may be used in combination with the present invention, but which are somewhat different from that disclosed in section A. The invention in sections B and C involves changing body bias signals applied to transistors in an integrated circuit in response to changing conditions to at least partially control a parameter of the integrated circuit. The invention may also include changing clock frequency signals and supply voltage signals to at least partially control a parameter. A parameter of the integrated circuit is a characteristic of the integrated circuit which can vary during performance including temperature, power consumption, and performance. Performance concerns the speed at which the integrated circuit performs a task. The integrated circuit may include a processor or other circuitry, or be included in a processor or other circuitry.

B. System Including Control Circuitry that Controls Bias Voltages

Figure 4:
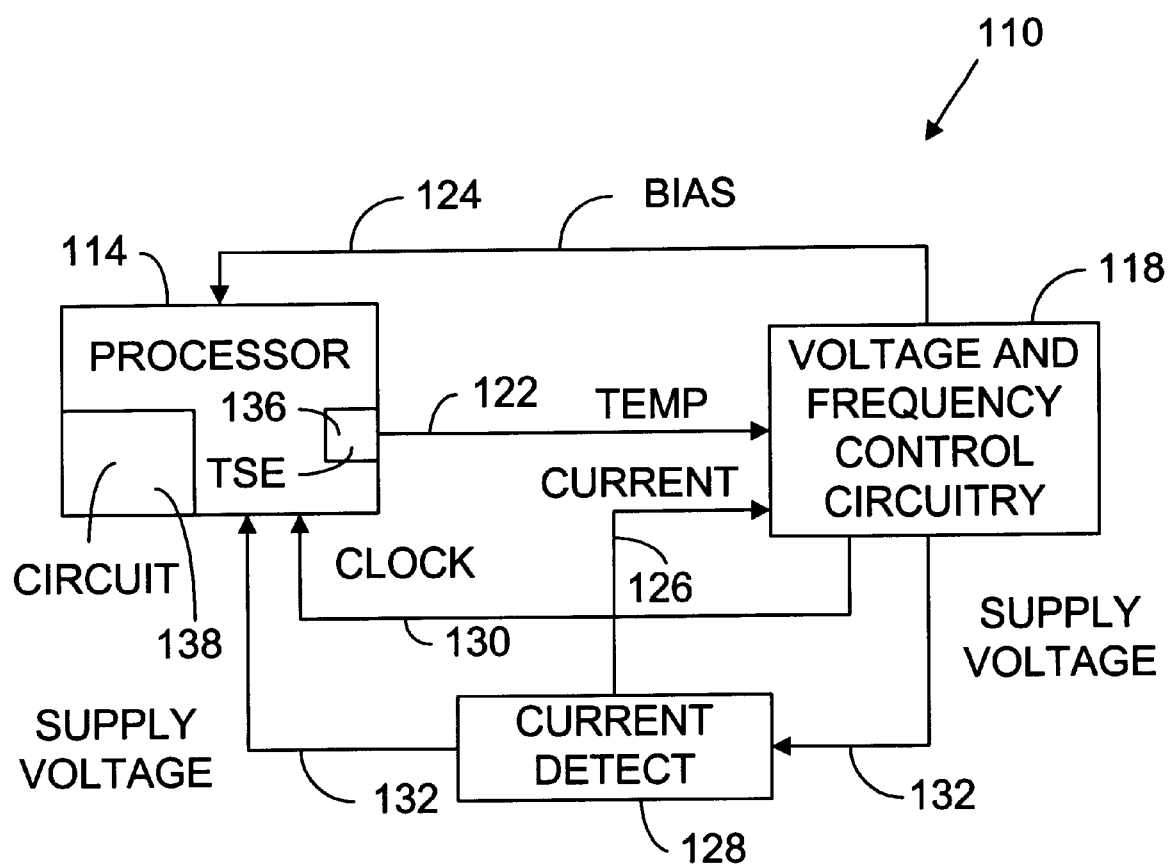
FIG. 4 is a block diagram representation of a computer system according to some embodiments of the invention.

Referring to FIG. 4, a computer system 110 includes a processor 114 and voltage and frequency control circuitry 118 (hereinafter control circuitry 118). The term "body bias, supply voltage, and/or clock settings" refers to the settings (i.e., levels) of the body bias signal(s), supply voltage signal(s), and/or clock setting signal(s) on conductor(s) 124, conductor(s) 132, and/or conductor(s) 130, respectively. The body bias signal(s) may be a control signal(s) to control body bias generation circuitry in the integrated circuit that provides the actual bias signals applied to the transistors. Alternatively, the body bias signal(s) may be the actual body bias signal(s) applied to the transistor bodies. In some embodiments, some transistors of the integrated circuit do not receive the actual body bias signals. The actual body bias signals may have different voltage levels at different times and different voltage levels to different transistors. The supply voltage signal(s) may be control signal(s) to control supply voltage generation circuitry that produce an actual supply voltage signal(s) (sometimes called Vcc or Vdd). Alternatively, the supply voltage signal(s) may be the actual supply voltage signal(s). The clock signal(s) may be control signal(s) to clock generation circuitry (e.g., including a phase locked loop) that produces the actual clock signal(s). Alternatively, the clock signal(s) may be the actual clock signal(s) used in the integrated circuit. Changing the setting of the clock signal(s) changes the frequency of the actual clock signals. Transistors in a circuit 138 are among those that the actual body bias signal(s), supply voltage(s), and/or clock signal(s) are applied. The actual body bias signal(s), supply voltage(s), and/or clock signal(s) may also be applied to other transistors in processor 114. Circuit 138 may be the entire chip including processor 138 or only a part of it.

In some embodiments, the body bias signal is closely coupled to the supply voltage signal so that the body bias signal may compensate for changes in the supply voltage signal.

Body bias refers to the relationship between voltage of the source (Vsource) of a field effect transistor (FET transistor) and voltage of the body (Vbb) of the FET transistor. The following chart summarizes types of body biases depending on Vsource and Vbb of a transistor in a typical configuration. In an n-channel FET transistor (nFET transistor), the source is of the "n" type and the body is of the "p" type. In a p-channel FET transistors (pFET transistor), the source is of the "p" type and the body is of the "n" type. The Vbb applied to the p-type body of an nFET transistor is referred to as Vbbp. The Vbb applied to the n-type body of a pFET transistor is referred to as Vbbn.

| Transistor | Bias | Body Bias Voltage | n v. p |
|---|---|---|---|
| nFET | Forward | Vbbp > Vsource | p > n |
| nFET | Zero | Vbbp = Vsource | p = n |
| nFET | Reverse | Vbbp < Vsource | p < n |

-continued

| Transistor | Bias | Body Bias Voltage | n v. p |
|---|---|---|---|
| pFET | Forward | Vbbn < Vsource | p > n |
| pFET | Zero | Vbbn = Vsource | p = n |
| pFET | Reverse | Vbbn > Vsource | p < n |

As Vbbp increases or Vbbn decreases with respect to Vsource, the threshold voltage (Vt) of the transistor is lower. Conversely, as Vbbp decreases or Vbbn increases with respect to Vsource, the threshold voltage is higher. For example, the threshold voltage is less with a forward bias, than with a zero bias. The switching speed is increased with a lower threshold voltage and increased with a higher threshold voltage. The leakage power consumption is higher with a smaller threshold voltage and lower with a higher threshold voltage. The active power consumption may also be effected by body bias. A lower threshold allows a higher clock rate which means results in more active power. Heat is related to power consumption.

Processor 114 is intended to include any circuitry that processes including microprocessors, digital signal processors, and ASICs. Processor 114 does not necessarily have to process software, but may process in response to other signals. However, processor 114 may receive instructions from programs and an operating system. Processor 114 may include an entire chip or merely be part of the circuitry in a chip. For example, processor 114 may be considered to be that portion of a chip that receives a supply signal from control circuitry 118. Control circuitry 118 may be on the same chip as processor 114.

Control circuitry 118 changes the body bias, supply voltage, and/or clock settings to at least partially to control one or more parameters of processor 114. Note that even though only part of the body bias, supply voltage and/or clock signal(s) might be applied to only part of the transistors on the integrated circuit, they can at least partially control the parameter of the entire integrated circuit. Control circuitry 118 may be control the settings in a variety of ways or modes. The following are some of the modes.

1. Responses to changes in temperature.

In some embodiments, control circuitry 118 monitors a temperature signal on conductor(s) 122. The temperature signals is related to the temperature of processor 136. A temperature sensitive element (TSE) 136, such as a diode, may be used in connection with a circuit to provide the temperature signal. TSE 136 may be on or in the chip of processor 136 or on packaging covering the chip of processor 136.

In some embodiments, if the temperature $T_{ACTUAL}$ of processor 114 as represented in the temperature signal on conductor(s) 122 exceeds an upper temperature limit $T_{HIGH}$, control circuitry 118 changes the body bias, supply voltage, and/or clock signal settings to decreases temperature. For example, the supply voltage and clock frequency may be decreased, and/or body bias signals changed so that the threshold voltage is raised. In some embodiments, if $T_{ACTUAL}$ drops below a lower temperature limit $T_{LOW}$, control circuitry 118 may increase the supply voltage, increase the clock frequency, and/or the change the bias voltages so that the threshold voltage is lowered. Having the lower temperature limit is not required. However, a lower temperature limit may be used in various ways. For example, three settings of supply voltage, frequency, and bias voltage may be used, wherein a first setting may occur if $T_{PROC}$ is less than $T_{LOW}$, a second setting may occur if $T_{PROC}$ is between T$_{LOW}$ is between T$_{LOW}$ and T$_{HIGH}$, and a third setting may occur if T$_{PROC}$ is greater than T$_{HIGH}$. Alternatively, there may be hysteresis (like in the thermostat of a furnace) where the settings for above T$_H$ remain until T$_{PROC}$ becomes less than T$_L$ and the settings for below T$_L$ remain until T$_{PROC}$ is greater than T$_H$. Note throughout the disclosure, a "greater than" or "less than" relationship may replaced with a "greater than or equal to" or "less than or equal to" relationship.

An ISO temperature mode is one in which control circuitry 118 seeks to keep the temperature constant. One example of a constant temperature is at exactly Tx, which may be T$_{HIGH}$ or some other temperature. Another example of a constant temperature is in a range between TL and TH. Other temperatures modes may be used.

There are many possible settings. For example, in different settings, different ones of the body bias, supply voltage, and clock signals may be changed by different amounts or left alone if already at a desired setting.

2. Power considerations

In some embodiments, control circuitry 118 receives a current signal on conductor(s) 126 from current detection circuitry 128 (which may include a small resistor). In other embodiments, system 110 does not include current detection circuitry 128 and conductor(s) 126. For example, a current detector 128 is not illustrated in FIG. 6, although it could be included in that system. Control circuitry 118 may consider the current signal (which when multiplied by the supply voltage indicates the active power consumption) in deciding how to control the settings.

Figure 5:
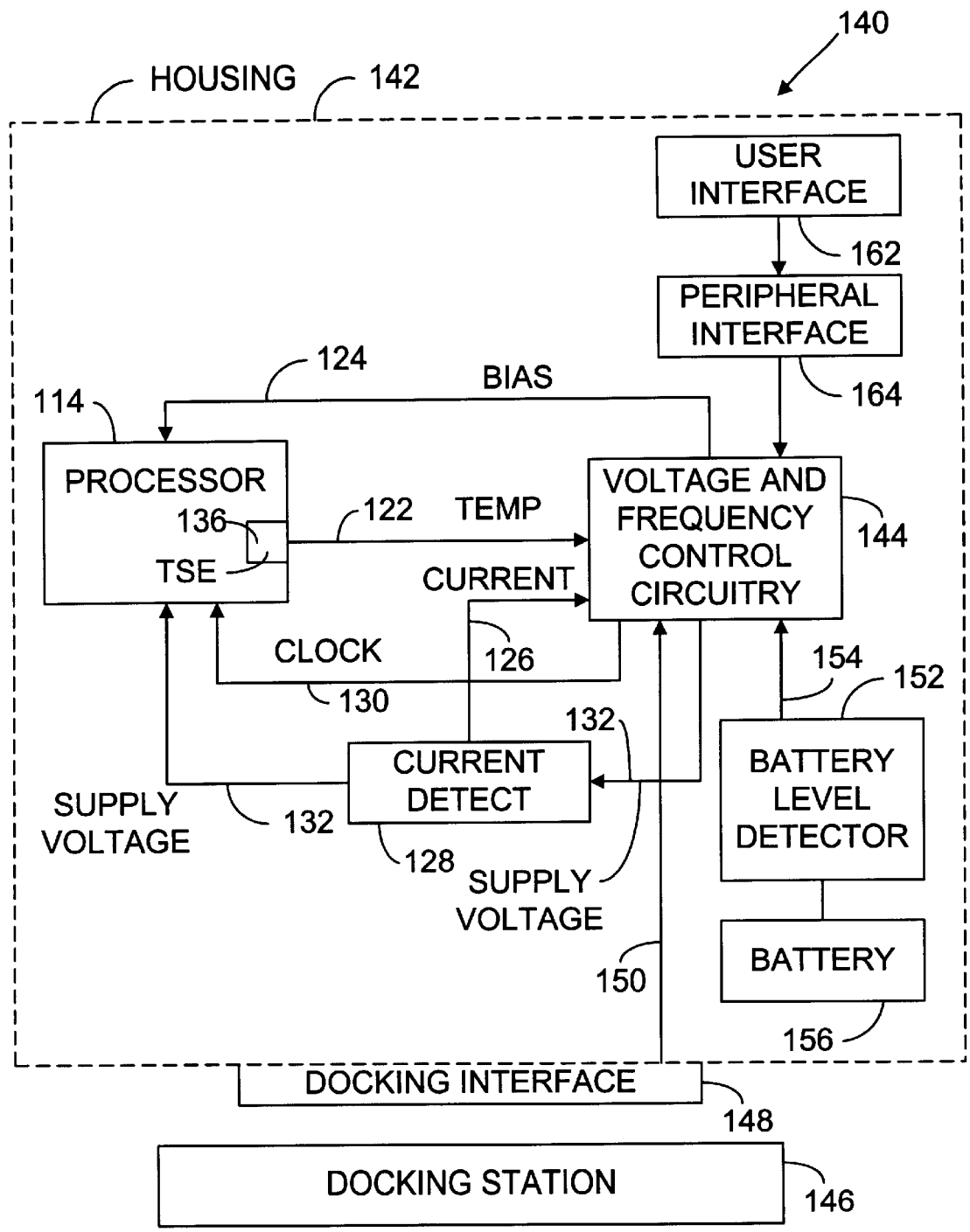
FIG. 5 is a block diagram representation of a computer system including a docking station according to some embodiments of the invention.

Referring to FIG. 5, a computer system 140 is similar to computer system 110. However, computer system 140 includes a battery level detector 152 to detect the voltage level of a battery 156. A battery level signal is provided on conductor(s) 154 to voltage and frequency control circuitry 144. Further, system 140 includes a housing 142 that contains the components illustrated inside the dashed lines. Housing 142 and the components in it might be a mobile computer system, such as a laptop or palm top computer system.

System 140 includes a docking interface 148 that interfaces with a docking station 146. When connected to docking interface 148, docking station 146 provides electrical power to components in housing 142 and may also provide a thermal reduction mechanism that interfaces with thermal reduction mechanisms (not shown) in housing 142. A signal on conductor(s) 150 is received by control circuitry 144 indicating that housing 142 is interfaced with docking station 146. Note that some embodiments may include battery level detector 152 and battery 156 but not include docking interface 148. Control circuitry 144 may operate the same as voltage and control circuitry 114 except that it may further take into account the battery level signal and/or whether housing 142 is interfaced to docking station 146. System 140 does not require a docking interface and battery.

In some embodiments, when the battery level signal is below a certain level, the supply voltage is lowered, the frequency of a processor clock is lowered, and/or the bias signals are changed to raise the threshold voltages of some or all of the transistors. This will reduce the power consumption to maintain the battery. If the battery level signal is further reduced, the supply voltage may be further lowered, the frequency may be further lowered, an/or the bias signal may be changed to further raise the threshold voltages.

System 140 includes a user interface 162 (such as a keyboard and/or mouse) and a peripheral interface 164 whereby signals may be communicated from user interface 162 to control circuitry 144. (Alternatively, the signal could be communicated via processor 114. Note that to avoid clutter, FIG. 5 and the other figures do not illustrate various circuits and interconnect which those skilled in the art having the benefit of this disclosure would understand could be included, but which are not necessary for an understanding of the invention.) (Note that system 110 may also include user and peripheral interfaces.) The user may specify certain power conditions or a power versus performance tradeoff. For example, the user could specify that he or she wants the battery to last for 4 hours. Control circuitry 144 could then lower the supply voltage, lower the frequency of a clock of processor 114, and/or change the bias voltages of some or all transistors of processor 114. Control circuitry 144 may make additional changes as needed.

When housing 142 is interfaced to docking station 146, electrical power is being provided by an external source rather than by battery 156. In that case, to obtain higher processor performance, control circuitry 144 may increase supply voltage, increase the frequency of a clock of processor 114, and/or change the bias voltages to lower the threshold voltages of some or all of the transistors. When housing 142 is disconnected from docking station 146, control circuitry 144 may decrease supply voltage, decrease the frequency, and/or change the bias signals to raise the threshold voltage to sacrifice performance for power conversation. Further, when docking station 146 is not connected, the thermal reduction mechanism (if it is included) is not operational and temperature may be an issue.

In some embodiments, in contrast to power preserving modes described above, in an ISO power mode, control circuitry 118 or 144 attempts to maintain a constant power and uses the current signal on conductor 126 as feedback in determining whether to raise or lower supply voltage, frequency, and/or change bias signals to alter power consumption.

Note that system 110 and 140 do not have to include TSE 36 and conductor 122. That is, they may make supply voltage, frequency, and body bias determinations without regard to temperature.

Control circuitry 118 and 144 may make tradeoffs between active and leakage power consumption.

3. Performance considerations

In some respects, performance is increased by the settings that cause a decrease in power consumption and vice versa. There are various tradeoffs and merely changing one of the supply voltage, clock frequency, or threshold voltages, without changing the others may not yield the desired results. By providing proper settings with each of supply voltage, clock frequency, and threshold voltages, a high processor performance can be achieved. Nevertheless, even in those embodiments in which frequency is not changed, leakage power can still be reduced by increasing the threshold voltages.

In an ISO performance mode, the performance is held constant. Performance is related to the rate at which transistors can switch states. With a forward bias, the threshold voltage is lower and transistors can switch states faster. With faster switching, the clock frequency can be higher which yields greater processor performance. If for some reason, the supply voltage is lower than specified, then control circuitry 118 may cause the body bias voltages (Vbbn and/or Vbbp) of transistors to be changed to reduce the threshold voltages, compensating for the loss of performance caused by the reduced supply voltage. On the other hand, if the supply voltage is higher than specified, control circuitry 118 causes body bias voltages to be changed to raise the threshold voltages. This has the effect of reducing active leakage power.

Although, ISO power, ISO thermal, and ISO performance modes are options, control circuitry 114 or 144 may seek a balance between power and performance. The supply voltage, frequency, and bias signals may be set to achieve the balance. For example, where power or heat is a concern, processor 114 may run at lower than maximum performance to reduce power and temperature.

The process of selecting the body bias, supply voltage, and/or clock settings in control circuitry 114 and 144 may be iterative process involving feedback from signals indicative of levels of the parameters (such as temperature and current) and others signals indicating preference (such a battery level signals and user selections).

C. Software Control

Figure 6:
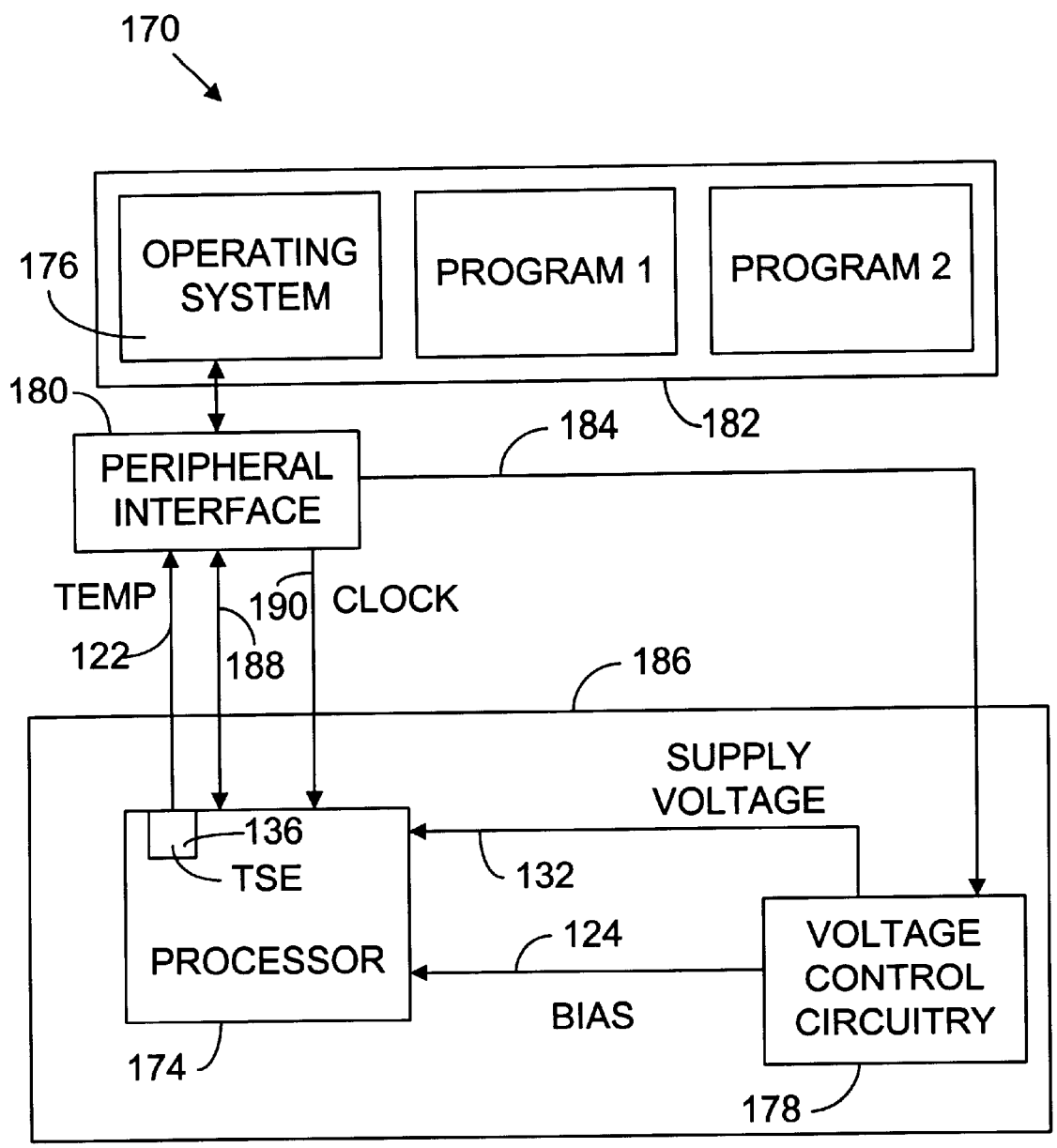
FIG. 6 is a block diagram representation of a computer system including a memory having an operating system and programs according to some embodiments of the invention.

Referring to FIG. 6, a computer system 170 includes a processor 174 and voltage control circuitry 178. Processor 174 may be identical to processor 114. A peripheral interface 180 includes a memory controller that controls a memory 182. Memory 182 represents any of various forms of memory including DRAM, a hard drives, a CD-ROM, and an on die cache. Peripheral interface 80 includes frequency control circuitry that provides a frequency signal on conductors 190 to processor 174. Conductors 184 can carry a processor signal resulting from execution of software, such as the operating system or programs 1 or 2. Peripheral interface 180 also include control circuitry that provides signals over conductors 184 to voltage control circuitry 178 to control, for example, the body bias, supply voltage, and/or clock signal settings to be provided to processor 174 in response to execution of the software or in response to other signals. Peripheral interface 180 may be on the same chip as is processor 174 or on a different chip. Voltage control circuitry 178 may be on the same chip (e.g., chip 186) as is processor 174 or on a different chip. Some functions of peripheral interface 180 could be on chip 186.

Peripheral interface 180 communicates with processor 174 through conductors 188. The frequency signal could be applied through conductors 188. System 170 includes a temperature sensitive element (TSE) 136 on the chip of processor 174, in the chip of processor 174, or on packaging for the chip of processor 174. A temperature signal is applied through conductor(s) 122. In some embodiments, system 170 does not include a temperature sensitive element.

Memory 182 includes an operating system 176 and one or more programs (e.g., program 1 and program 2). Operating system 176 may be a general operating system, similar to Microsoft® Windows 98 that handles a wide variety of tasks, or a special purpose operating system which works in conjunction with a general operating system such as Microsoft® Windows 98. In some embodiments, the only purpose of the special purpose operating system is to control the gathering of data regarding how processor intensive are the programs being run (which may include operating system 176). In this respect, the special purpose operating system may be thought of as a program. Programs 1 and 2 may be any of a variety of programs. For example, program 1 is a program which is processor resource intensive and program 2 is not processor resource intensive. Programs that are more processor resource intensive cause the processor to consume more power and create more heat.

Figure 7:
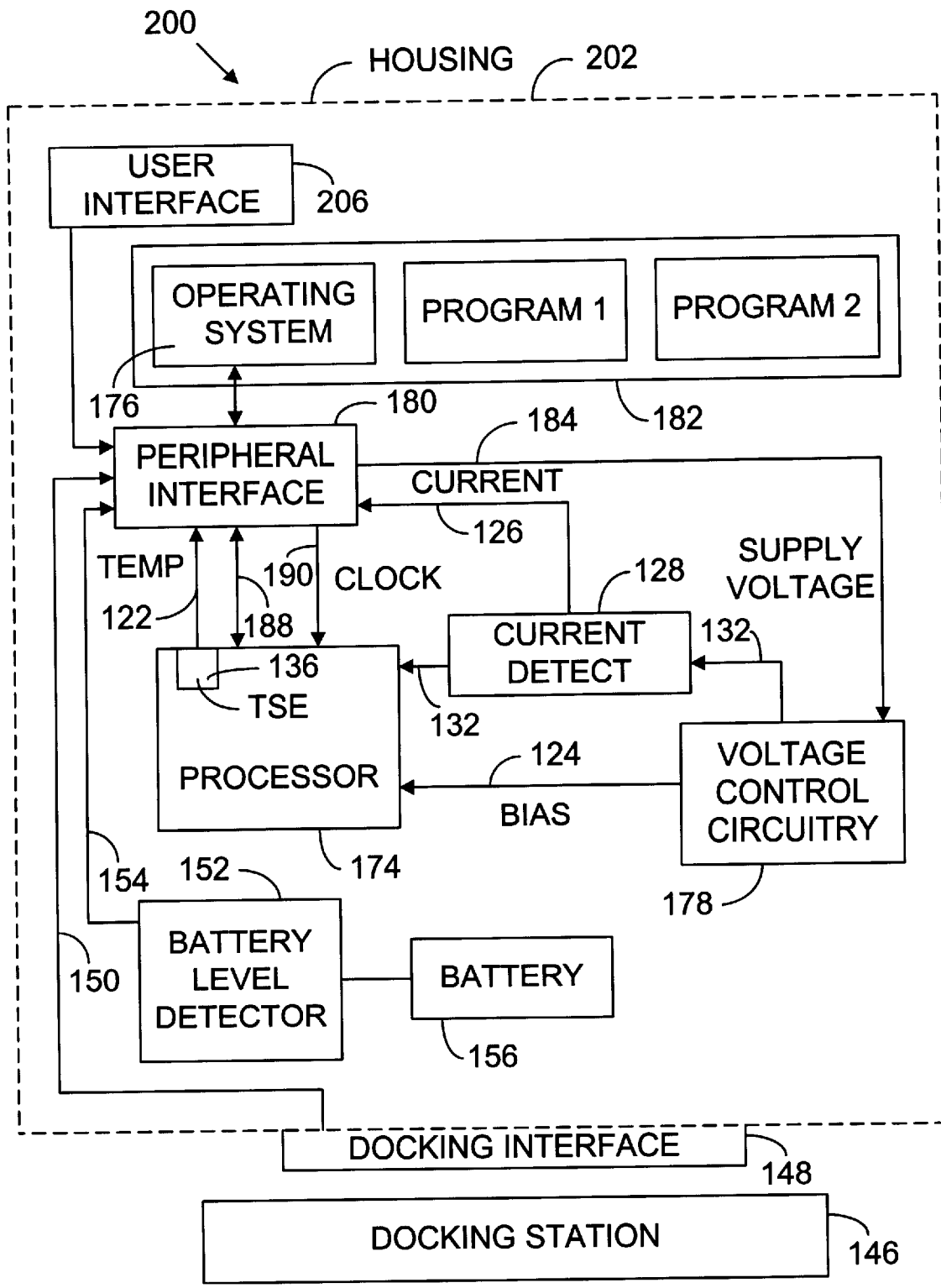
FIG. 7 is a block diagram representation of a computer system including a memory having an operating system and programs, and a docking station according to some embodiments of the invention.

FIG. 7 illustrates a computer system 200 which is similar to computer system 170 except that computer system 200 expressly includes the following components, which are not necessarily in system 170. Current detection circuitry 128 provides an indication of the current being consumed by processor 174 and provides a current signal on conductor(s) 126 indicative thereof. In some embodiments, system 200 does not include current detection circuitry. System 200 includes a housing 202 that includes the components inside the dashed line. Housing 202 includes a docking interface 148, a docking station 146, battery level detector 152, and battery 156, as described in connection with FIG. 5. Further, system 200 includes a user interface 206 which may be the same as user interface 162 in FIG. 5.

System 170 may operate the same as system 110 of FIG. 4 with respect to the body bias, supply voltage, and/or clock settings in response to changes in temperature and power consumption. System 200 may operate the same described above in connection with system 140 of FIG. 5 with respect to the body bias, supply voltage, and/or clock settings in response input signals reflecting changes in temperature, power consumption, user settings, battery level signals, and docking station interface conditions. More specifically, these were described in sections B.1, B.2, and B.3 of this disclosure. However, in system 170 and 200, these the determination of the settings may occur by circuitry in peripheral interface 180 in response to software control of operating system 176 and/or a program, rather than in hardware as in control circuitry 118 and 144. In addition, systems 170 and 200 can make the following determinations through software.

1. Operating System determination of processor resource intensiveness.

Operating system 176 can make a determination as to how processor resource intensive the programs or sections thereof are. There are various ways in which this can be done. In some embodiments, operating system 176 measures the current processor resource intensiveness and uses that measurement as a prediction as to future processor resource intensiveness. In many cases, the current activity of a processor is a good predictor of how active the processor will be in the near future. For example, if processor 174 is performing processor resource intensive tasks at time X, it is often a good indicator that processor 174 will perform processor resource intensive tasks at time X+delta, where delta is small. When the processor is performing processor intensive tasks, it may be desirable to increase the processor performance temporarily while until the task is complete, even if it involves increase power consumption and temperature. Operating system 176 may make this monitor frequently (e.g., between once a millisecond and once a second) to determine whether to change the settings of the supply voltage signal(s), frequency signal(s), and/or bias signal(s) to increase processor performance.

In some embodiments, operating system 176 looks and counts the number of certain instructions which are likely to be processor resource intensive. If the number is greater than (or alternatively, greater than or equal to) a threshold number, operating system 176 can change the settings of the supply voltage signal(s), frequency signal(s), and/or bias signal(s) to increase processor performance.

Note that the measurement and monitoring tasks described in this section C.1. can be performed in hardware in peripheral interface 180 or voltage and frequency control circuitry as well as in operating system 176. The hardware making the measurements or monitoring can be in processor 114 or 174.

Operating system 176 can use the information to distribute performing of the instructions of different programs.

Profiling of a program, either before or after compiling could be used to determine the computer intensiveness.

The user can provide an indication through user interface 206 as to whether he or she wants high processor performance and operating system 176 can respond accordingly. As described above, the user may also provide battery life settings and operating system 176 can also consider these in determining the settings of the supply voltage signal(s), frequency signal(s), and bias signal(s).

2. Programs with express indications as to their processor resource intensiveness.

The programs can be programmed to include an indication as to how processor resource intensive they are. For example, the programs could include a rating instructions recognized by operating system 176. Different sections of a program could include a different rating instruction. For example, some sections of a program could have instructions which are very processor resource intensive while other sections of the program may have instructions which are not processor resource intensive.

Operating system 176 could consider the rating of the programs (or the sections thereof) it is causing to be run in determining what should be the body bias, supply voltage, and/or clock settings. A section of a program involving computer resource intensive instructions may be called a critical region. For example, in system 200, just prior to processor 174 executing the critical region, operating system 176 could cause the performance of processor 174 to temporarily be increased through changing the settings, even though doing so will increase power consumption. The settings can be changed again to coincide with completion of execution of the critical region of the program. Operating system 176 can make these changes in settings to increase performance even though other indicators (described in sections B.1 or B.2 above), would indicate the settings should be such that processor consumes less power and/or generate less heat.

In some embodiments, operating system 176 could consider the ratings in determining which programs or sections thereof to run at a particular time (e.g., in multi-tasking). The settings could be switched as resources switch between programs.

In some embodiments, operating system 176 could take an average or a sum of ratings in determining the processor resource intensiveness.

Having the program include an instruction indicating the processor performance level at which it should be run can be referred to as performance on demand.

The invention described in connection with FIGS. 4–7 is not restricted to single chip, but rather control circuitry 114 and peripheral peripheral interface 180 and voltage control circuitry 178 may also be used to control the settings for more than one chip (e.g., multiple processors).

D. Additional Information and Embodiments

Figure 8:
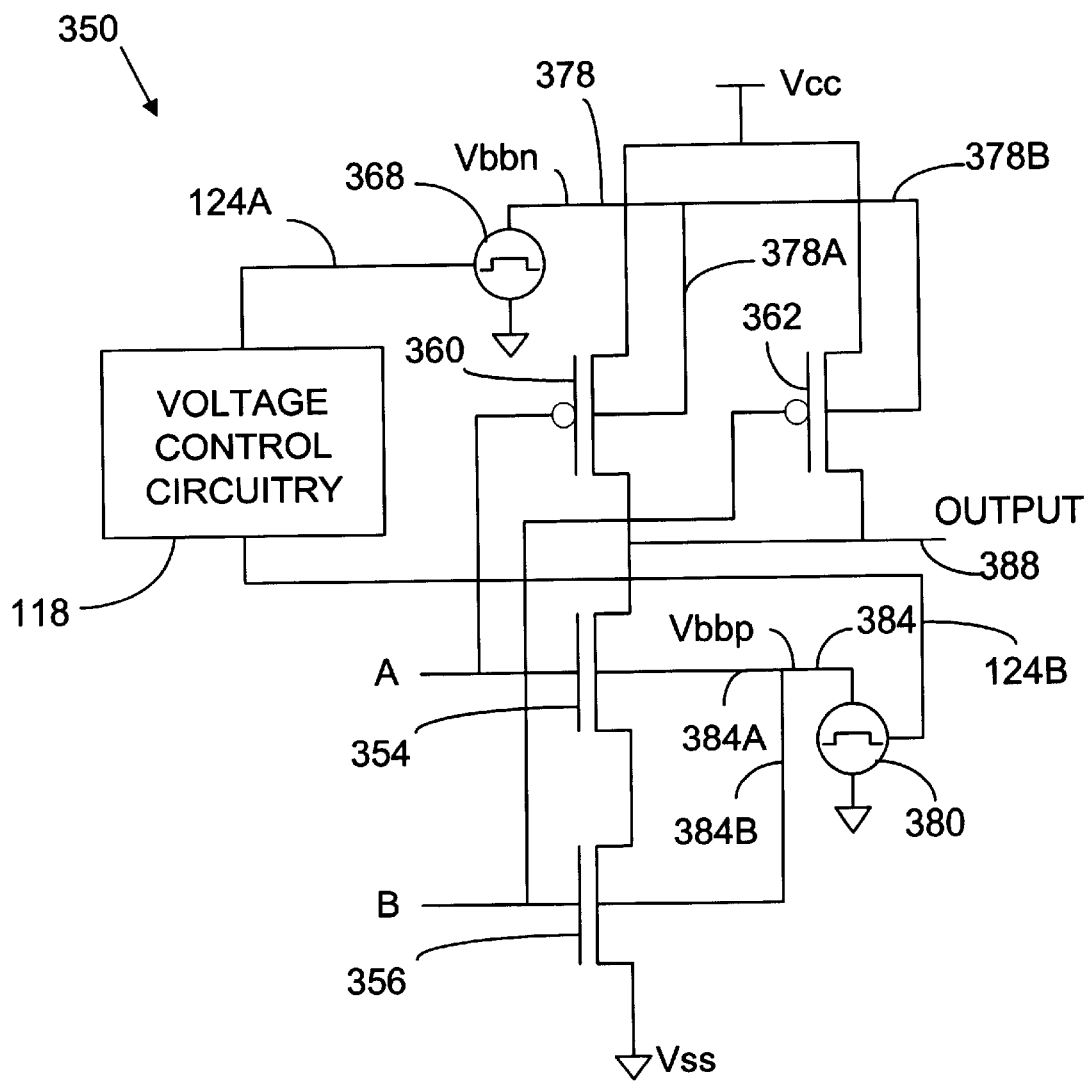
FIG. 8 is a schematic and block diagram representation of transistors receiving actual body bias signals Vbbn and Vbbp.

FIG. 8 illustrates a two-input NAND gate circuit 350 in connection with control circuitry 118. Inputs A and B are at the gates of nFET transistors 354 and 356 and at the gates of pFET transistors 360 and 362. The sources of transistors 360 and 362 are connected in parallel to the output of circuit 350 on conductor 388. Control circuitry 118 provides body bias signals on conductors 124A and 124B to control body bias generating circuitry 368 and 380. Body bias generating circuitry 368 provides actual body bias signals Vbbn on conductor 378 at different voltages depending on a setting of the body bias signal on conductor 124A. Body bias generating circuitry 368 provides actual body bias signals Vbbp at different voltages on conductor 384 depending on a setting of the body bias signal on conductor 124B. Depending on the embodiment, the pn junctions may have only one or more than one different levels of forward body bias, a zero bias, and one or more than more level of reverse body bias.

Figure 9:
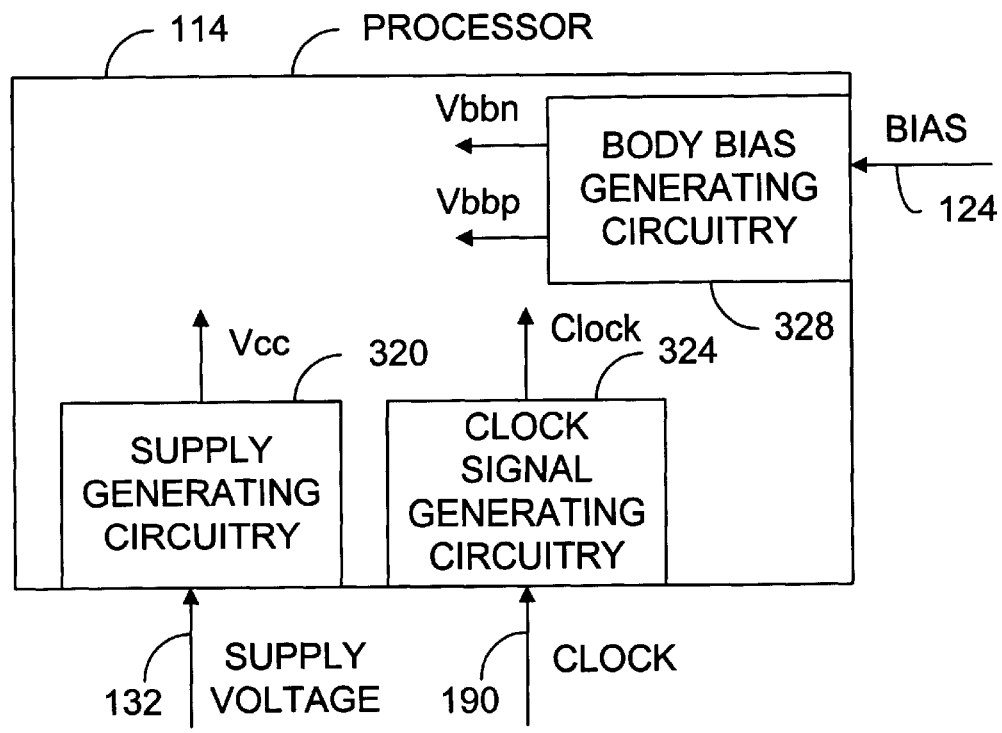
FIG. 9 is a block diagram representation of supply producing circuitry, clock signal producing circuitry, and body bias generating circuitry according to some embodiments of the invention.
Figure 10:
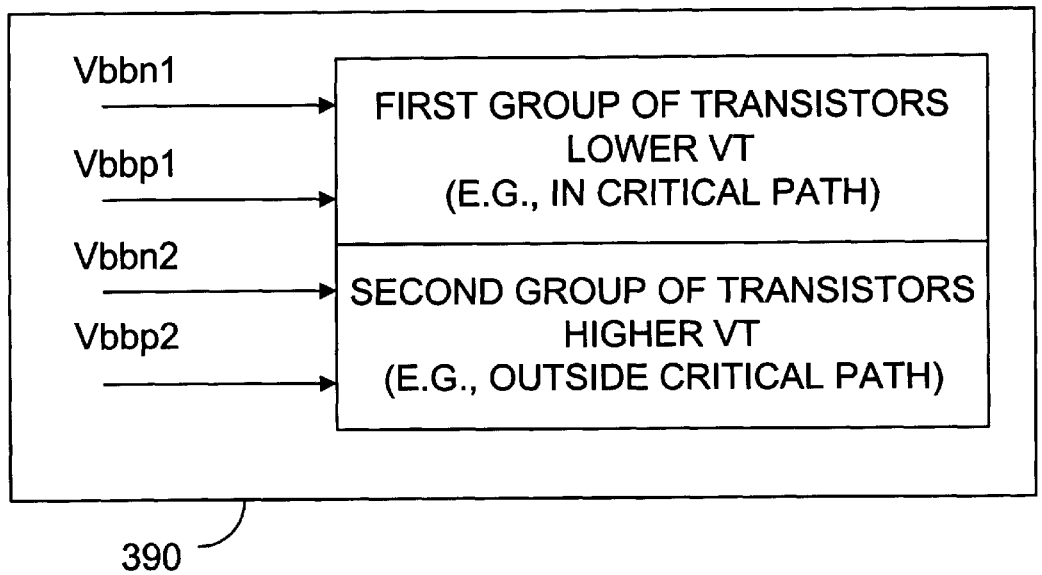
FIG. 10 is a block diagram illustrating different groups of transistors receiving different body bias signals.

Referring to FIG. 9, in some embodiments, supply voltage generating circuitry 320 which provides one or more supply voltage signals in response to one or more supply voltage signals on conductor(s) 132 is included in processor 114. Clock signal producing circuitry 324 provides one or more clock signals, the frequencies of which depend on the clock signal on conductor(s) 190. Body bias generating circuitry 328 may be circuitry 368 and/or 380. Supply voltage generating circuitry 320, clock signal producing circuitry 324, and body bias generating circuitry 328 may be in a processor or other integrated circuitry or in the control circuitry. FIG. 10 illustrates that different transistors may receive different levels of body bias signals.

A chip might have only p-FET transistors or only n-FET transistors. If the chip has both p-FET and n-FET transistors, some of them might be tied to a constant body bias (e.g., a zero bias).

In some embodiments, the insulating layer is positioned only under the source and drain, but not under the channel of at least some of the transistors. In some embodiments, insulating material can extend underneath the source, drain, and channel.

The body bias signals may be applied through various parts of the chip. For example, the Vbb signals (Vbbn and Vbbp) may be applied through two pins in a package for the chip. The bulk of the chip, where either p or n type transistors are fabricated, which may be exposed from the back side of the chip, to supply one of the two (Vbbn or Vbbp) bias signals. In a wire bond technology, the bulk of the chip (back-side) may rest on a conducting shelf, may be used to supply a body bias signal. In C4 technology, an additional conductor can be mounted on the back side of the die (typically a heat sink) which can be used to supply the bias. A body bias signal can be applied to the heat sink. The body bias signal(s) may be applied to the surface through taps into the bodies.

Isolating structures may be used between wells or transistors in wells and transistors not in wells. For example, a bias in a p-well may be isolated from an n-well and other p-wells that may have a different body bias.

In some embodiments, isolating dielectrics is positioned beneath the source and drain to reduced junction capacitance, but does not extend beneath the channel. In other embodiments, there is no isolation. In still other embodiments, an SOI structure may be used.

In some embodiments, clock gating or throttling might be used.

Various circuits including an integrator followed by an A/D converter can be used to convert the temperature signal to a useable signal in the control circuitry.

In some embodiments, control circuitry 114, 144, etc., does not control the frequency of the clock signal. In that case, the clock signal can be applied to the control circuitry can receive a clock signal. Various circuits including an integrator followed by an A/D converter can be used to convert the clock signal to a useable signal in the control circuitry.

Various circuits including an analog multiplier/convoluter followed by an A/D converter can be used to combine signals in the control circuitry.

The supply signals, bias signals, and frequency signals may be analog or digital.

There may be intermediate structure (such as a buffer) or signals between two illustrated structures or within a structure (such as a conductor) that is illustrated as being continuous. The borders of the boxes in the figures are for illustrative purposes and not intended to be restrictive.

If the specification states a component, feature, structure, or characteristic "may", "might", or "could" be included, that particular component, feature, structure, or characteristic is not required to be included. Reference in the specification to "some embodiments" means that a particular feature, structure, or characteristic described in connection with the embodiments is included in at least some embodiments, but not necessarily all embodiments, of the invention. The various appearances "some embodiments" are not necessarily all referring to the same embodiments.

The term "responsive" is used to means that A is responsive to B is A is somewhat influenced by B, although A might also be influenced by other things. The term "control" means to at least partially control.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A system comprising:
   a first domain;
   a second domain;
   first performance detection circuitry including some transistors of the first domain to provide a first performance rating signal indicative of transistor switching rates of the first domain;
   second performance detection circuitry including some transistors of the second domain to provide a second performance rating signal indicative of transistor switching rates the second domain; and
   control circuitry to receive the first and second performance rating signals and control a setting for a body bias signal for the first domain and control a setting for a body bias signal for the second domain responsive to the performance rating signals.

2. The system of claim 1, wherein the first and second domains have clock signals with a same frequency and the bias values are set such that the transistors of the first and second domains can switch properly while the first and second domains have the clock signals and wherein one of the first and second domains operates at less than optimal performance.

3. The system of claim 1, wherein the bias values are set through an iterative process wherein the values for the body bias signals are applied to the first and second domains and resulting changes to the first and second performance rating signal are considered.

4. The system of claim 1, wherein the control circuitry sets a value for a supply voltage signal for the first domain and control a setting for a supply voltage signal for the second domain responsive to the performance rating signals.

5. The system of claim 4, wherein the supply voltages and bias values are set through an iterative process wherein the values for the supply voltage and body bias signals are applied to the first and second domains and resulting changes to the first and second performance rating signal are considered.

6. The system of claim 4, wherein the control circuitry sets a value for a clock signal for the first domain and control a setting for a clock signal for the second domain responsive to the performance rating signals.

7. The system of claim 6, wherein the supply voltages, bias values, and clock signals are set through an iterative process wherein the values for the supply voltage, body bias, and clock signals are applied to the first and second domains and resulting changes to the first and second performance rating signal are considered.

8. The system of claim 6, wherein the supply voltage signals and clock signals are control signals to circuitry that provides actual supply voltages and clock signals.

9. The system of claim 1, wherein the body bias signals are further set responsive to a power signal received by the control circuitry which is indicative of a power consideration.

10. The system of claim 9, wherein the power signal is a first power signal and the control circuitry is further set responsive to a second power signal received by the control circuitry which is indicative of another power consideration.

11. The system of claim 9, further including a battery level detector and wherein the power signal is responsive to a battery level detection signal.

12. The system of claim 9, further including a memory including an operating system coupled to the control circuitry and wherein the power signal is responsive to the operating system.

13. The system of claim 1, wherein the body bias signals are further set responsive to a performance signal received by the control circuitry which is indicative of a performance consideration.

14. The system of claim 1, wherein the body bias signals are first body bias signals and the control circuitry further sets a second body bias signal for the first domain and a second body bias signal for the second domain.

15. The system of claim 1, where setting the value includes leaving the value alone if it is currently at a desired value.

16. The system of claim 1, wherein the body bias signals are further set responsive to a temperature signal received by the control circuitry which is indicative of a temperature consideration.

17. The system of claim 1, wherein the first and second performance detection circuitry include ring oscillators formed of inverters including the some transistors of the first and second domain, respectively.

18. The system of claim 1, wherein the domains are on a same chip.

19. The system of claim 1, wherein the domains are on different chips.

20. The system of claim 1, wherein there is a first domain, and performance detection circuitry including some transistors of the third domain to provide a third performance rating signal indicative of transistor switching rates the third domain and the control circuitry receive the third performance rating signal and sets value for body bias signals for the first, second, and third domains responsive to the performance rating signals.

21. A system comprising:
   a first domain;
   a second domain;
   first performance detection circuitry including some transistors of the first domain to provide a performance rating signal indicative of transistor switching rates of the first domain;
   second performance detection circuitry including some transistors of the second domain to provide a performance rating signal indicative of transistor switching rates the second domain; and
   control circuitry to receive the first and second performance rating signals and control a setting for a body bias signal for the first domain and control a setting for a body bias signal for the second domain responsive to the performance rating signals, and to provide a first and second clock signals to the first and second domains, respectively.

22. The system of claim 21, wherein the first and second clock signals are identical and the bias values are set such that the transistors of the first and second domains can switch properly while the first and second domains have the clock signals and wherein one of the first and second domains operates at less than optimal performance.

23. The system of claim 21, wherein the bias values are set through an iterative process wherein the values for the body bias signals are applied to the first and second domains and resulting changes to the first and second performance rating signal are considered.

24. The system of claim 21, wherein the control circuitry sets a value for a supply voltage signal for the first domain and control a setting for a supply voltage signal for the second domain responsive to the performance rating signals.

25. The system of claim 21, wherein the control circuitry sets a value for a clock signal for the first domain and control a setting for a clock signal for the second domain responsive to the performance rating signals.

26. A method of domain mismatch detection and reduction, comprising:

providing a first performance rating signal indicative of transistor switching rates of a first domain;

providing a first performance rating signal indicative of transistor switching rates a second domain; and receiving the first and second performance rating signals by control circuitry and setting a value for a body bias signal for the first domain and control a setting for a body bias signal for the second domain responsive to the performance rating signals.

27. The system of claim 26, wherein the bias values are set so that the first and second domains operate at a same clock frequency.

28. The system of claim 26, wherein the bias values are set through an iterative process wherein the values for the body bias signals are applied to the first and second domains and resulting changes to the first and second performance rating signal are considered.

* * * * *